United States Patent
Gabriel et al.

(10) Patent No.: US 11,324,113 B2
(45) Date of Patent: May 3, 2022

(54) ELECTRICAL CONDUCTORS

(71) Applicant: 3M INNOVATIVE PROPERTIES COMPANY, St. Paul, MN (US)

(72) Inventors: Nicholas T. Gabriel, Woodbury, MN (US); Ronald D. Jesme, Plymouth, MN (US); Andrew J. Ouderkirk, St. Paul, MN (US); Ravi Palaniswamy, Singapore (SG); Andrew P. Bonifas, Edmonton (CA); Alejandro Aldrin A. Narag, II, Singapore (SG); Robert M. Jennings, Shoreview, MN (US); Robin E. Gorrell, Round Rock, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 16/843,282

(22) Filed: Apr. 8, 2020

(65) Prior Publication Data

US 2020/0236780 A1    Jul. 23, 2020

Related U.S. Application Data

(63) Continuation of application No. 15/536,394, filed as application No. PCT/US2015/065504 on Dec. 14, 2015, now Pat. No. 10,653,006.

(Continued)

(51) Int. Cl.
*H05K 1/02* (2006.01)
*H01Q 1/22* (2006.01)

(Continued)

(52) U.S. Cl.
CPC ......... *H05K 1/0283* (2013.01); *H01Q 1/2225* (2013.01); *H01Q 1/36* (2013.01);
(Continued)

(58) Field of Classification Search
CPC ................... H05K 1/165; H05K 1/189; H05K 2201/09727; H05K 2201/09736; H05K 1/0283; H05K 1/186; H01L 23/4985
See application file for complete search history.

(56) References Cited

U.S. PATENT DOCUMENTS 4,605,934 A    8/1986  Andrews
4,994,771 A    2/1991  Takamine et al.
(Continued)

FOREIGN PATENT DOCUMENTS

DE    202013002682    6/2013
EP    2690585    1/2014
(Continued)

OTHER PUBLICATIONS

Li, "Physical and Mechanical Properties of Copper and Copper Alloys", Comprehensive Nuclear Materials, 2012, vol. 4, pp. 667-690.

(Continued)

*Primary Examiner* — Mirza F Alam
(74) *Attorney, Agent, or Firm* — Jonathan L. Tolstedt

(57) ABSTRACT

Electrical conductors are disclosed. More particularly, undulating electrical conductors are disclosed. Certain disclosed electrical conductors may be suitable to be disposed on flexible or stretchable substrates.

7 Claims, 6 Drawing Sheets

Related U.S. Application Data

(60) Provisional application No. 62/098,133, filed on Dec. 30, 2014.

(51) Int. Cl.
  *H01Q 1/36* (2006.01)
  *H05K 1/16* (2006.01)
  *H05K 1/18* (2006.01)
  *G06K 19/02* (2006.01)

(52) U.S. Cl.
  CPC ........... *H05K 1/165* (2013.01); *G06K 19/025* (2013.01); *H05K 1/0277* (2013.01); *H05K 1/189* (2013.01); *H05K 2201/09263* (2013.01); *H05K 2201/09272* (2013.01); *H05K 2201/09727* (2013.01); *H05K 2201/09736* (2013.01); *H05K 2201/10098* (2013.01)

(56) References Cited

U.S. PATENT DOCUMENTS

| | | | |
|---|---|---|---|
| 5,939,952 A | 8/1999 | Noda | |
| 7,195,733 B2 | 3/2007 | Rogers | |
| 8,628,818 B1 | 1/2014 | Sharma | |
| 2002/0094701 A1 | 7/2002 | Biegelsen | |
| 2003/0222727 A1 | 12/2003 | McCurdy | |
| 2004/0192082 A1* | 9/2004 | Wagner | H05K 1/11 439/67 |
| 2004/0200801 A1 | 10/2004 | Lai | |
| 2004/0243204 A1* | 12/2004 | Maghribi | A61N 1/05 607/115 |
| 2005/0236739 A1 | 10/2005 | Willson | |
| 2005/0238967 A1 | 10/2005 | Rogers | |
| 2006/0185540 A1 | 8/2006 | Kornilovich | |
| 2006/0279425 A1 | 12/2006 | Forster | |
| 2007/0200708 A1 | 8/2007 | Hayama et al. | |
| 2008/0157235 A1 | 7/2008 | Rogers | |
| 2008/0257586 A1* | 10/2008 | Chen | H05K 1/0283 174/254 |
| 2008/0288037 A1 | 11/2008 | Neysmith | |
| 2010/0059863 A1 | 3/2010 | Rogers | |
| 2011/0302770 A1* | 12/2011 | Radenne | G06K 19/07749 29/600 |
| 2012/0051005 A1* | 3/2012 | Vanfleteren | H01L 23/3142 361/749 |
| 2012/0052268 A1 | 3/2012 | Axisa | |
| 2013/0019353 A1 | 1/2013 | Liu | |
| 2013/0041235 A1 | 2/2013 | Rogers | |
| 2014/0097944 A1* | 4/2014 | Fastert | G06K 19/027 340/10.51 |
| 2014/0299362 A1 | 10/2014 | Park | |

FOREIGN PATENT DOCUMENTS

| | | |
|---|---|---|
| JP | 2011-233822 | 11/2011 |
| WO | WO 2000-54107 | 9/2000 |
| WO | WO 2009-111641 | 9/2009 |
| WO | WO 2010-101633 | 9/2010 |
| WO | WO 2013-022853 | 2/2013 |
| WO | WO 2013-044226 | 3/2013 |
| WO | WO 2014-011222 | 1/2014 |

OTHER PUBLICATIONS

International Search Report for PCT International Application No. PCT/US2015/065504, dated Sep. 23, 2016, 8pgs.

\* cited by examiner

ELECTRICAL CONDUCTORS

BACKGROUND

Electrical conductors are portions of conductive material adapted to carry electrical information from one location to another location. Electrical conductors having appropriate characteristics can be used as transmitting, receiving, or transmitting/receiving antennas. Electrical conductors configured to be exposed to shear and strain forces may break or be damaged by those stresses or may weaken over time.

SUMMARY

In one aspect, the present disclosure relates to elongated conductors. The elongated conductors are centered on an axis along a length of the conductor such that the axis has a continuous first derivative with respect to a reference line, the reference line being parallel to an elongation direction of the conductor. The first derivative is zero at a plurality of spaced apart first locations, the axis has a second derivative with respect to the reference line discontinuous at at least one second location, and the conductor at each first location is wider than at each second location.

In another aspect, the present disclosure relates to elongated conductors centered on an axis along a length of the conductor, such that the axis has a continuous first derivative with respect to a reference line, the reference line being parallel to an elongation direction of the conductor. The first derivative is zero at a plurality of spaced apart first locations, the axis has a second derivative with respect to the reference line that is substantially zero at at least one second location, and the conductor at each first location is wider than at each second location. In some embodiments the at least one second location includes at least two second locations.

In yet another aspect, the present disclosure relates to an elongated undulating conductor centered on an axis along a length of the conductor and defining a plane of the conductor, the conductor having a width along a direction parallel to the plane of the conductor. The axis has a continuous radius of curvature and at a plurality of spaced apart first location the axis has a local minimum radius of curvature and the conductor has a local maximum width. In some embodiments, the local maximum width at each first location is greater than the width of the conductor at any other location that is not a first location. In some embodiments, a magnitude of a second derivative of the axis with respect to a reference line the reference line being parallel to an elongation direction of the conductor, is continuous along the length of the conductor.

In another aspect, the present disclosure relates to an electrically continuous conductor elongated along a length of the conductor, the conductor having a substantially constant height, a varying width, and a varying radius of curvature along the length of the conductor. Along the length of the conductor, a greater radius of curvature of the conductor corresponds to a smaller width of the conductor and a smaller radius of curvature of the conductor corresponds to a greater width of the conductor. In some embodiments, along the length of the conductor, locations of substantially equal radii of curvature correspond to substantially equal widths.

In yet another aspect, the present disclosure relates to an electrically continuous conductor elongated along a length of the conductor, the conductor having a varying width and a varying radius of curvature along the length of the conductor. Along the length of the conductor, the width of the conductor increases with decreasing radius of curvature of the conductor, and the width of the conductor decreases with increasing radius of curvature of the conductor.

In another aspect, the present disclosure relates to an elongated conductor centered on an axis along a length of the conductor. At each of a plurality of spaced apart first location on the axis, a line tangent to the axis at the first location is parallel to an elongation direction of the conductor, and at each of the plurality of spaced apart second locations on the axis, a line tangent to the axis at the second location not being parallel to the reference line. The conductor is wider at each first location and narrower at each second location.

In yet another aspect, the present disclosure relates to a conductor assembly. The conductor assembly includes a flexible stretchable substrate stretchable along a first direction up to 1.5 times an original unstretched dimension of the substrate without tearing and a conductor disposed on the substrate and generally extending along the first direction, the conductor centered on an axis along a length of the conductor, such that for a plurality of alternating first and second locations along the axis the conductor is wider at each first location than at each second location. In some embodiments, the axis has a smaller radius of curvature at each first location than at each second location.

In another aspect, the present disclosure relates to an electrically continuous conductor elongated along a length of the conductor, the conductor having a varying thickness and a varying radius of curvature along the length of the conductor. Along the length of the conductor, a greater radius of curvature of the conductor corresponds to a smaller thickness of the conductor and a smaller radius of curvature of the conductor corresponds to a greater thickness of the conductor. In some embodiments, the conductor has a varying width along the length of the conductor, such that along the length of the conductor, a greater radius of curvature of the conductor corresponds to a smaller width of the conductor and a smaller radius of curvature of the conductor corresponds to a greater width of the conductor.

In yet another aspect, the present disclosure relates to a radio frequency identification tag. The radio frequency identification tag includes a flexible stretchable substrate and an antenna disposed on the substrate and centered on an axis along a length of the antenna. For a plurality of spaced apart first and second locations along the axis, the antenna is wider at each first location than at each second location, and the axis has a smaller radius of curvature at each first location than at each second location. In some embodiments, the substrate is stretchable up to 1.5 times an original unstretched dimension of the substrate without tearing.

In another aspect, the present disclosure relates to a radio frequency identification tag. The radio frequency identification tag includes a flexible stretchable substrate and an antenna disposed on the substrate. The antenna has a plurality of first zones and a plurality of second zones: each first zone including a plurality of concentric first arcs, each second zone including a plurality of concentric second arcs, and each first arc of each first zone being wider than each second arc of each second zone.

In yet another aspect, the present disclosure relates to a radio frequency identification tag. The radio frequency identification tag includes a flexible stretchable substrate and an elongated undulating electrode disposed on the substrate and centered on an axis along a length of the electrode. Along the length of the electrode, the axis has a continuous radius of curvature and the electrode includes parallel narrower top and wider bottom substantially planar surfaces with corresponding top and bottom opposing first and second lateral edges. For each point along the axis, a plane normal to the axis at the point intersects the top and bottom first edges at corresponding top and bottom first points, and a straight line connecting the top and bottom first points makes an angle with the bottom surface of the electrode that is between 60 and 85 degrees.

In another aspect, the present disclosure relates to a radio frequency identification tag. The radio frequency identification tag includes a flexible substrate stretchable along a first direction with a structured surface including a plurality of linear structures extending along a second direction perpendicular to the first direction. The radio frequency identification tag also includes an antenna formed on the structured surface and extending across at least two linear structures in the plurality of linear structures. In some embodiments, the plurality of linear structures are linear prisms.

DETAILED DESCRIPTION

Electronic devices intended to be used in high-stress environments, for example, wearable electronics for attachment to skin or mounted on the head or on clothing, may be subject to shear and strain beyond the typical tolerances for conventional electrical components. For example, a conductor disposed within a rigid housing, for example, is largely protected from the stress of movement, while a skin- or clothing-mounted component is subject to human movement, including standing, sitting, and bending, for example. Simply providing a conventional conductor on a stretchable substrate, for example, may not be sufficient, as it may be desirable for the conductor to be able to sustain repeating bending and stretching without damage or degradation in performance. Certain design considerations or their combinations disclosed herein may enable a robustness suitable for these applications.

Figure 1:
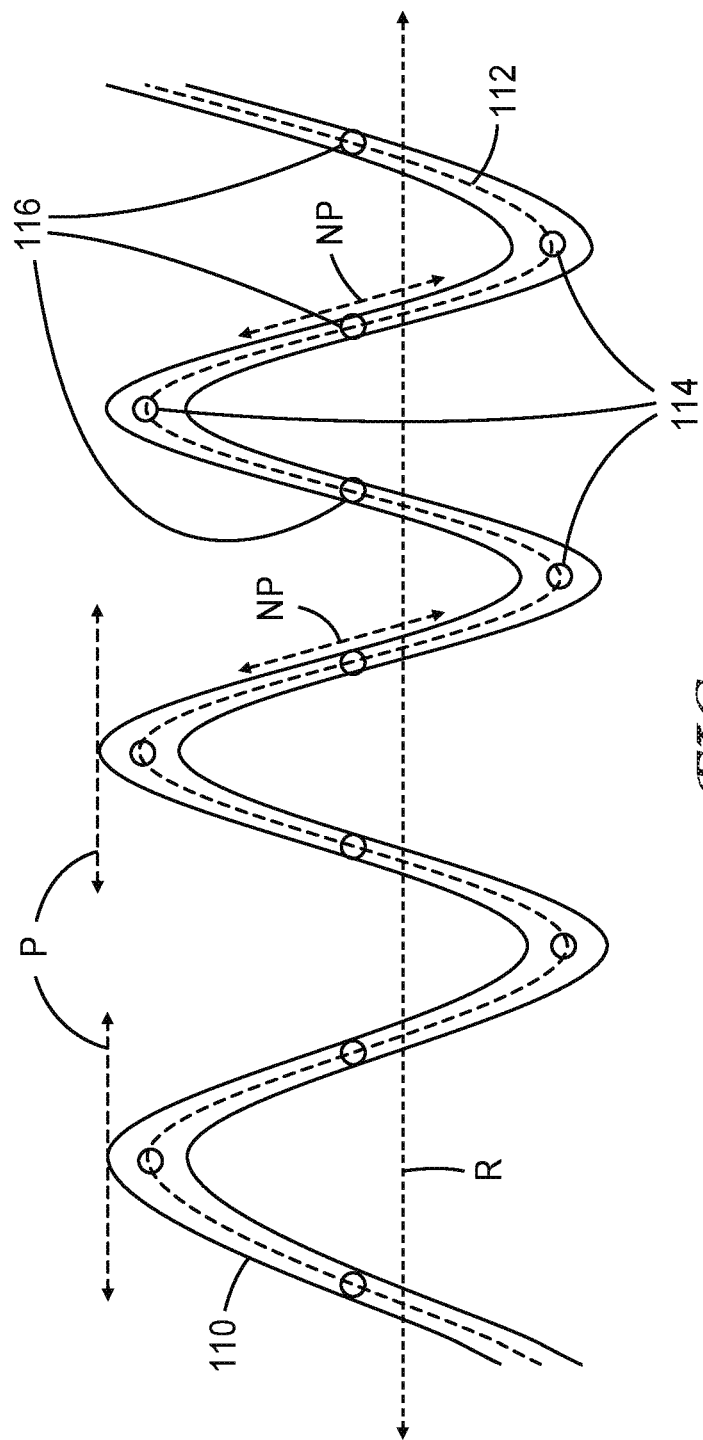
FIG. 1 is a top plan view of a portion of an electrical conductor.

FIG. 1 is a top plan view of a portion of an electrical conductor. Conductor 110 includes axis 112, plurality of first locations 114, and plurality of second locations 116. Reference line R, and parallel and non-parallel tangent lines P, and NP, respectively, are also depicted. Conductor 110 may be only a portion of the total extent of the conductor, but the portion shown in FIG. 1 is sufficient to explain certain of its features.

Conductor 110 is formed from any suitable material and formed through any suitable process for electrically conductive traces. For example, conductor 110 may be formed from copper, gold, platinum, silver, or aluminum, or alloys of the same. In some embodiments, non-metallic conductors, such as graphite may be used, or composites made from particles, flake, nanofibers, or nanosheets of materials such as carbon, silicon, or metals. The conductive material may also include inks of, for example, metal particles, including metal parts with a particle size between 10 nm and 100 microns. The conductive material may include graphitic, amorphous, or pyrolytic carbon. The material may include or be nanowires, such as silver and gold nanowires. The material may be coated with silver and silver chloride. The material for conductor 110 may be selected for its conductivity, corrosion resistance, ductility, malleability, or any other physical or electrical property. Conductor 110 may further include potting, conformal coating, insulation, or electrical isolation coatings. Suitable materials include polyurethanes, silicones, polyesters, polyolefins, and other suitable elastomers and polymers.

Conductor 110 may be formed from one or more photolithography (and/or etching) steps. Conductor 110 may be formed by physical or chemical vapor deposition or electroplating or electroforming. The deposition can happen with or without a binder. Any other suitable additive or subtractive processes or combinations may be used. In some embodiments conductor 110 may formed by physical manipulation of the metal, such as bending, pressing, and/or stamping. Other processes such as milling, etching, chemical mechanical milling, or abrading may be used to selectively remove material.

Conductor 110 may be a continuous conductor, in that it does not include discontinuities or breaks in conductivity, such that electrical information could be transported from one end of the conductor to the other. Electrical information could be or include electrical power, signal, data, or the like. Axis 112 is centered along the conductor. In other words, at each point along axis 112, the two shortest distances to the edges of conductor 110 are equal. The shape of conductor 110 may be, in some embodiments, sinusoidal or undulating. The shape of conductor 110 may include both sinusoidal portions and straight portions. In some embodiments, the conductor may function as or be configured as an electrode.

Along axis 112 lie a plurality of first locations 114 and second locations 116. Several methods are possible for locating or defining the first and second locations. For example, the first and second locations may be defined by the width of the conductor. For example, the widest locations or local maximum widths along axis 112 may be first locations 114, while the thinnest portions or local minimum widths along axis 112 may be second locations 116. The local maximum width at each first location may be greater than the width of conductor 110 at any other location along axis 112 that is not a first location. In some embodiments, first and second locations along axis 112 may be characterized by the radius of curvature of the axis at those locations. Locations with the smaller radius of curvature or local minimum radius of curvature may be first locations 114, while locations with the largest radius of curvature or local maximum radius of curvature may be second locations 116. For purposes of this description, the radius of curvature at a location is a scalar positive value that is inversely proportional to the magnitude of curvature, such that the minimum possible radius of curvature approaches zero and the maximum possible radius of curvature approaches positive infinity. For a curve having a second derivative, the radius of curvature at a location along the curve is inversely proportional to the magnitude of the second derivative at that location.

In some embodiments, first and second locations may be defined by the derivatives of axis 112 with respect to a reference line. Reference line R in FIG. 1 is parallel to an elongation direction of conductor 110. For example, there may exist, a coordinate system of two orthogonal axes where, traveling along axis 112, only one of the coordinates undulates. The non-undulating axis may be referred to as the elongation direction. Alternatively, there may exist a coordinate system in which the conductor periodically has the same maximum value; in these embodiments, the reference line is parallel to a line connecting these same maximum values. In other embodiments, the conductor has a bulk length (that is, not following axis 112 but in terms of the overall shape fit into a rectangle) that is much greater than a bulk width of the conductor. In this method, the bulk length is the elongation direction. In some embodiments, reference line R may be formed from the best fit line through points where the radius of curvature (of the axis or the conductor) changes from increasing to decreasing or vice versa. In some embodiments, there exists a coordinate system where axis 112 is a mathematical function; in these embodiments, the reference line is or is parallel to the line represent by the ordered pairs of (domain, 0) in this coordinate system (in other words, the range is set equal to zero). In some embodiments, conductor 110 sits in a plane; in some embodiments, conductor 110 only partially sits in a plane. In some embodiments, the reference line may be determined with respect to a projection of conductor 110 onto a flat surface.

In some embodiments, the first derivative of the axis with respect to reference line R is continuous. In some embodiments, plurality of first locations 114 are the locations along axis 112 where the first derivative with respect to reference line R is zero. In some embodiments, the plurality of first locations 114 are the locations along axis 112 where a line tangent to axis 112 is parallel to reference line R. These are depicted in FIG. 1 by the lines marked P. The lines are slightly shifted apart from the axis for ease of illustration. In some embodiments, plurality of second locations 116 are where the first derivative of axis 112 with respect to reference line R is at a maximum or minimum. In some embodiments, plurality of second locations 116 are where the second derivative of axis 112 with respect to reference line R is zero. In some embodiments, plurality of second locations 116 are where the second derivative of axis 112 with respect to reference line R is discontinuous. In some embodiments, the plurality of second locations 116 are the locations along axis 112 where a line tangent to axis 112 forms the greatest angle with respect to reference line R. In some embodiments, the plurality of second locations 116 are locations along axis 112 where a line tangent to axis 112 is not parallel to reference line R. These are depicted in FIG. 1 by the lines marked NP. In some embodiments, some or all of the above methods for defining the first and second locations may overlap. In some embodiments, each of the first locations and the second locations may be spaced apart.

For conductor 110, however, the conductor is wider at each first location 114 as compared with each second location 116. In some embodiments, the conductor is higher (or thicker) at each first location 114 as compared with each second location 116. In some embodiments, conductor 110 is both wider and thicker at each first location 114 as compared with each second location 116. Producing a conductor with thicker first locations may be accomplished by multiple depositing or photolithography steps with appropriate masking, for example. In some embodiments, a portion of conductor 110 has these characteristics; in some embodiments, the entirety of conductor 110 has these characteristics. Other out-of- or in-to-plane features are possible for the conductor, such as bumps (either concave or convex), an undulating or sawtooth thickness profile, or other suitable structures. The features may be regular, irregular, pseudorandom, patterned, discontinuous, uniform, or non-uniform across a portion or the entirety of conductor 110.

Figure 2:
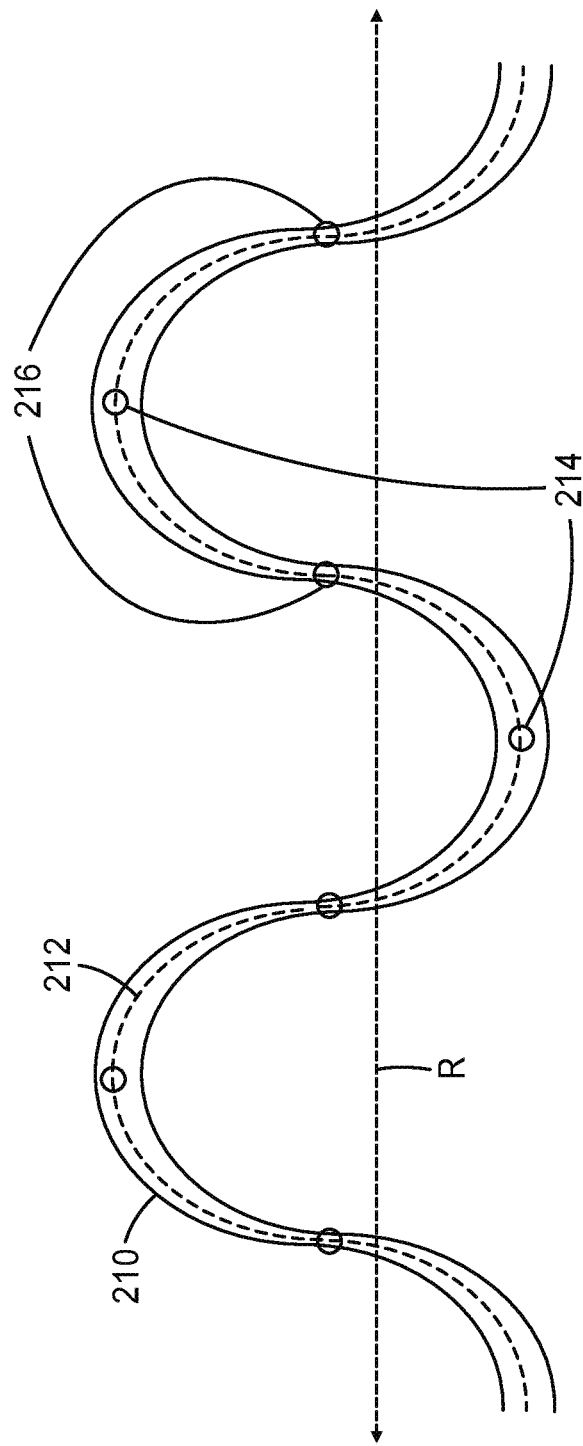
FIG. 2 is a top plan view of a portion of another electrical conductor.

FIG. 2 is a top plan view of a portion of another electrical conductor. Conductor 210 includes axis 212, plurality of first locations 214, and plurality of second locations 216. Reference line R is also depicted. Considering FIG. 1 and FIG. 2 together, each show a conductor (110, 210), with an axis (112, 212), and a plurality of first (114, 214) and second locations (116, 216). In each, the axis has a continuous first derivative with respect to reference line R. Conductor 210, however, has axis 212 which has a discontinuous second derivative with respect to reference line R at its plurality of second locations, while conductor 110 of FIG. 1 has an axis with a second derivative of zero with respect to reference line R at its plurality of second locations. Nonetheless, each of conductor 110 and conductor 210 have a greater width at the plurality of first locations versus the plurality of second locations. Tangent lines are not shown in FIG. 2, although the variety of metrics and methods for determining first and second locations may apply similarly to conductor 110 and 210.

Figure 3:
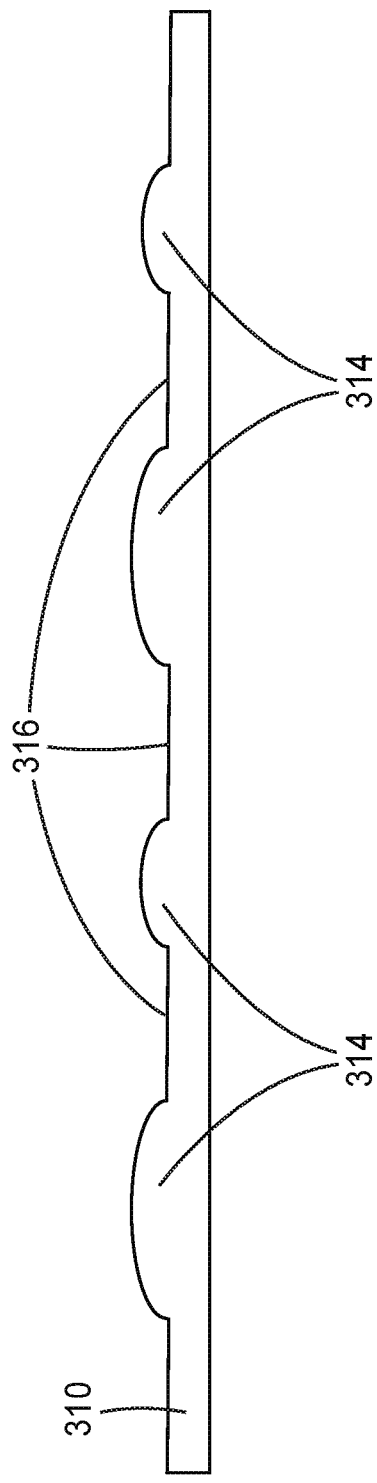
FIG. 3 is a side elevation view of a portion of an electrical conductor.

FIG. 3 is a side elevation view of a portion of an electrical conductor. Conductor 310 includes plurality of first location 314 and plurality of second locations 316. FIG. 3 depicts embodiments where first locations 314 have a greater thickness than second locations 316. As described elsewhere, the additional thickness may be provided by additional deposition or multiple photolithographic steps. The thickness may transition smoothly or there may be discontinuous portions of greater thickness (i.e., from side elevation views first locations 314 may look more rectangular than elliptical).

Figure 4:
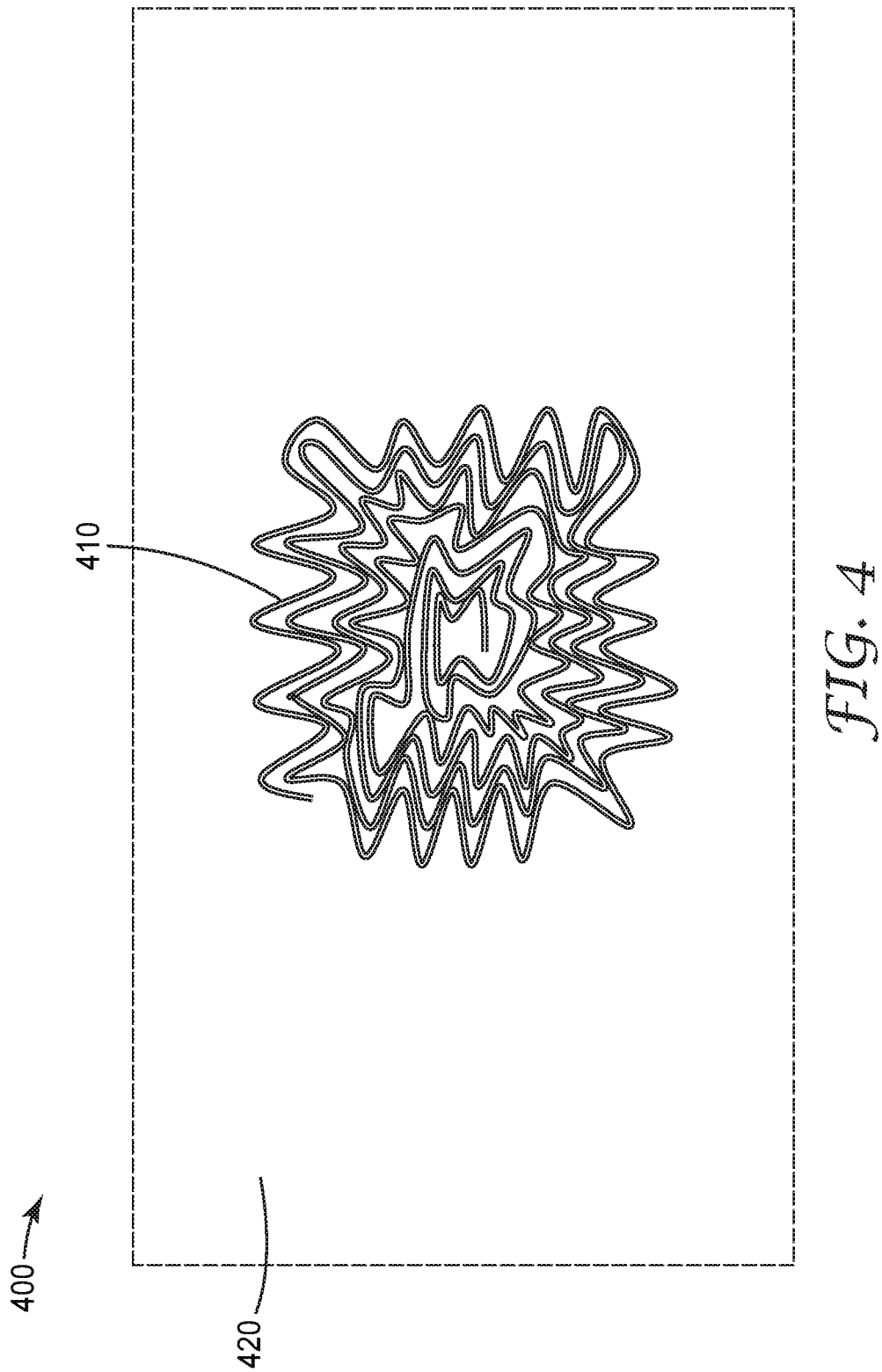
FIG. 4 is a top plan view of an antenna disposed on a substrate.

FIG. 4 is a top plan view of an antenna disposed on a substrate. Conductor assembly 400 includes antenna formed from conductor 410 disposed on substrate 420. Conductor 410 may be formed from the same materials and by the same process as described in conjunction with FIG. 1. However, FIG. 4 depicts conductor 410 in a configuration where conductor 410 spirals in (or out) on itself. In some embodiments, this may be to minimize two-dimensional extent (circuit density) while still providing a sufficient or appropriate length to receive or transmit desired electromagnetic frequencies or ranges of electromagnetic frequencies. In some embodiments, conductor 410 may be suitable for use as an antenna for a radio frequency ID tag, or RFID tag. This may include a suitable integrated circuit (not shown) for processing, modulating, and/or demodulating interrogating radio frequencies. The RFID tag may be powered by an integrated or attached power source, such as a battery, or it may be powered by the interrogating radio frequency waves themselves. In some embodiments, the antenna including conductor 410 may be compatible with near field communication (NFC) protocols and standards. In some embodiments, conductor 410 may include suitable electronics to transmit radio or other electromagnetic frequencies.

Conductor 410 is shown as somewhat arbitrarily and erratically shaped in FIG. 4 to show the design flexibility. In some embodiments, conductor 410 is more orderly shaped, with concentric (at least at those points) arcs providing a closer effective packing of the conductor in a limited two-dimensional area. Conductor 410 in some embodiments has a continuous radius of curvature. Conductor 410 may have a plurality of first locations and a plurality of second locations, where the first locations are wider than the second locations, and the conductor at the first locations has a smaller radius of curvature than the conductor at the second locations. Differences in width for the conductor are not illustrated in FIG. 4 in favor of highlighting the overall shape of conductor 410. In some embodiments, conductor 410 is thicker at first locations compared with second locations, and the conductor at the first locations has a smaller radius of curvature than at the second locations. In some embodiments, the width of the conductor may increase as the radius of curvature of the conductor decreases, and the width may decrease as the radius of curvature of the conductor increases. In some embodiments, the thickness can vary in the same way as described for the width either in addition to or instead of the width.

Substrate 420 may be any suitable material, and conductor 410 may be formed on or in substrate 420, or conductor 410 may be adhered or attached to substrate 420. In some embodiments, substrate 420 is both above and below conductor 410, sandwiching it. Substrate 420 may have any suitable size. Substrate 420 is depicted with dashed lines indicating that the overall shape and size is not critical to conductor assembly 400, and substrate 420 may have any suitable shape, size, and thickness. In some embodiments, substrate 420 is stretchable or flexible. In some embodiments, the material of substrate 420 is selected for its ability to conform or adhere to skin. In some embodiments, the substrate may be, be similar to, or include TEGADERM brand wound dressings, available from 3M Company, St. Paul, Minn. Substrate 420 may be or include an elastomeric, viscoelastic, elastic, or rubber material or substance. In some embodiments, substrate 420 is transparent. In some embodiments, substrate 420 may be stretchable to at least 1.5 times an original dimension without tearing. In some embodiments, the substrate may be stretchable to at least 2 or 3 times an original dimension without tearing. In some embodiments, instead of or in addition to stretching without tearing, the substrate may be stretchable to at least 1.5, 2, or 3 times an original dimension without buckling, stress cracking, or fracturing. In some embodiments, the substrate may return or substantially return to its original dimensions, and in some embodiments, the substrate may be designed to be stretched only once (and retain its stretched dimensions). In some embodiments, substrate 420 includes an adhesive or adhesive layer for attachment to a surface. In some embodiments, a portion, for example, a corner, of substrate 420 does not have an adhesive for easy removal after being attached. In some embodiments, substrate 420 includes a structured surface or otherwise varying thickness.

Figure 5:
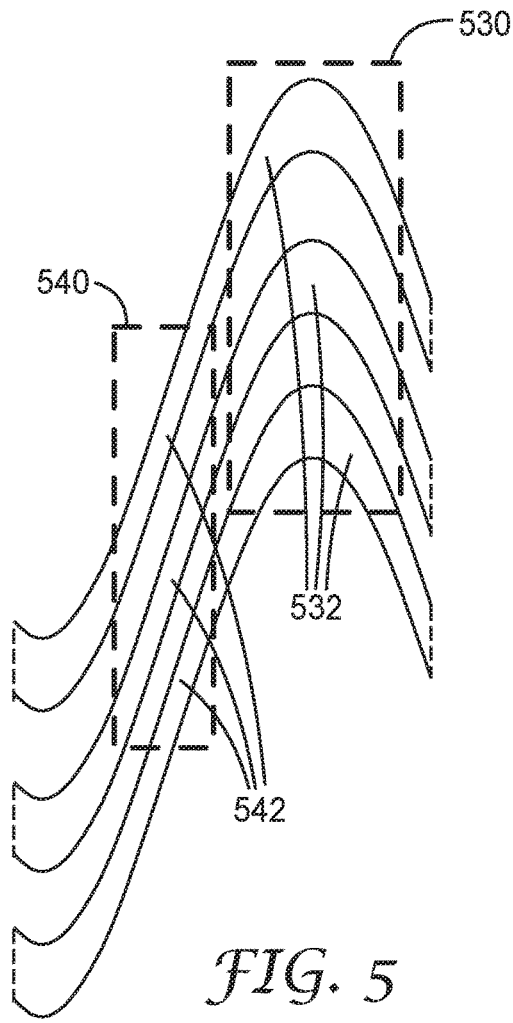
FIG. 5 is a close-up of a portion of an antenna.

FIG. 5 is a close-up of a portion of an antenna. Antenna portion 500 includes first zone 530 including concentric first arcs 532 and second zone 540 including concentric second arcs 542. Antenna portion 500 includes conductive material such as that used for any other of the conductor described herein. FIG. 5 illustrates two zones: first zone 530 and second zone 540. Each of first zone 530 and second zone 540 includes several concentric arcs of the conductor. First zone 530 includes concentric first arcs 532. Second zone 540 includes concentric second arcs 542. Each of concentric first arcs 532 is wider than concentric second arcs 542. In some embodiments, each of concentric first arcs 532 is thicker than concentric second arcs 542 in addition to or instead of being wider.

Figure 6:
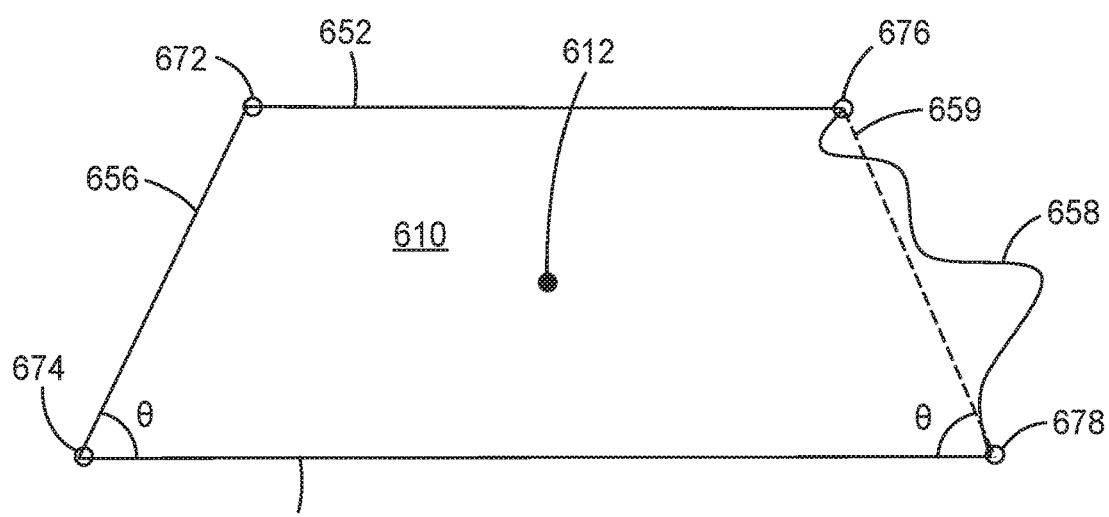
FIG. 6 is a front elevation cross-section of an electrical conductor.

FIG. 6 is a front elevation cross-section of an electrical conductor. Electrical conductor 610 includes axis 612 (perpendicular to the plane of the page), top surface 652, bottom surface 654, first side surface 656 and second side surface 658, top first point 672, bottom first point 674, top second point 676, bottom second point 678, and straight line 659. Top surface 652 and bottom surface 654 are parallel or substantially parallel. In some embodiments, the top and bottom surfaces have some degree of curvature over at least a part of the surface. In some cases, it may be acceptable that the two surfaces have parallel tangent lines. Top surface 652 is narrower than bottom surface 654. Top surface 652 has opposing first and second lateral edges such that at each point along axis 612, a plane normal to the axis at the point intersects the first and second top lateral edges at first top point 672 and second top point 676. Bottom surface 654 likewise has opposing first and second lateral edges such that at each point along axis 612, a plane normal to the axis at the point intersects the first and second bottom lateral edges at first bottom point 674 and second bottom point 678.

First side surface 656 and second side surface 658 connect top surface 652 to bottom surface 654. In some embodiments, some or all of the side surface along the length of axis 612 is the surface representing the shortest path between the lateral edges of the top and bottom surfaces, such as for first side surface 656. In other embodiments, some or all of the side surface along the length of axis 612 has curves or facets, depending on the desired application. Second side surface 658 is one such example of possible design options available for the side surfaces. In any event, for conductor 610, which represents some embodiments, the angle formed between the line between first top point 672 and first bottom point 674 and bottom surface 654 is an angle, θ, between 60 and 85 degrees. In some embodiments, the angle formed between the line between second top point 676 and second bottom point 678 and bottom surface 654 is also an angle, θ, between 60 and 85 degrees.

Suitable methods for creating a conductor with an angle θ between 60 and 85 degrees include a semi-additive method. A dielectric film is first seeded with a tie layer of any suitable material; for example, chromium, followed by a thin base conductive layer. The substrate is electroplated to build the conductive layer (for example, a copper conductive layer) to several microns thick. A photoresist is applied to the seeded substrate and is patterned by photolithographic processes, including one or more photomask and exposure steps. Subsequently, a conductive material, which may be the same or different from the electroplated conductive layer, is electrodeposited onto the exposed portions of the thin conductive layer. In some embodiments, 40-50 microns of conductive material is electrodeposited, although the thickness may be tailored depending on the desired application. The photoresist is removed, exposing all of the conductive material (the thick portions and the thin base conductive layer). Processes such as milling, etching, reactive ion etching, chemical mechanical milling, or abrading may be used to selectively remove the exposed portions of the electroplated conductive layer.

Figure 7:
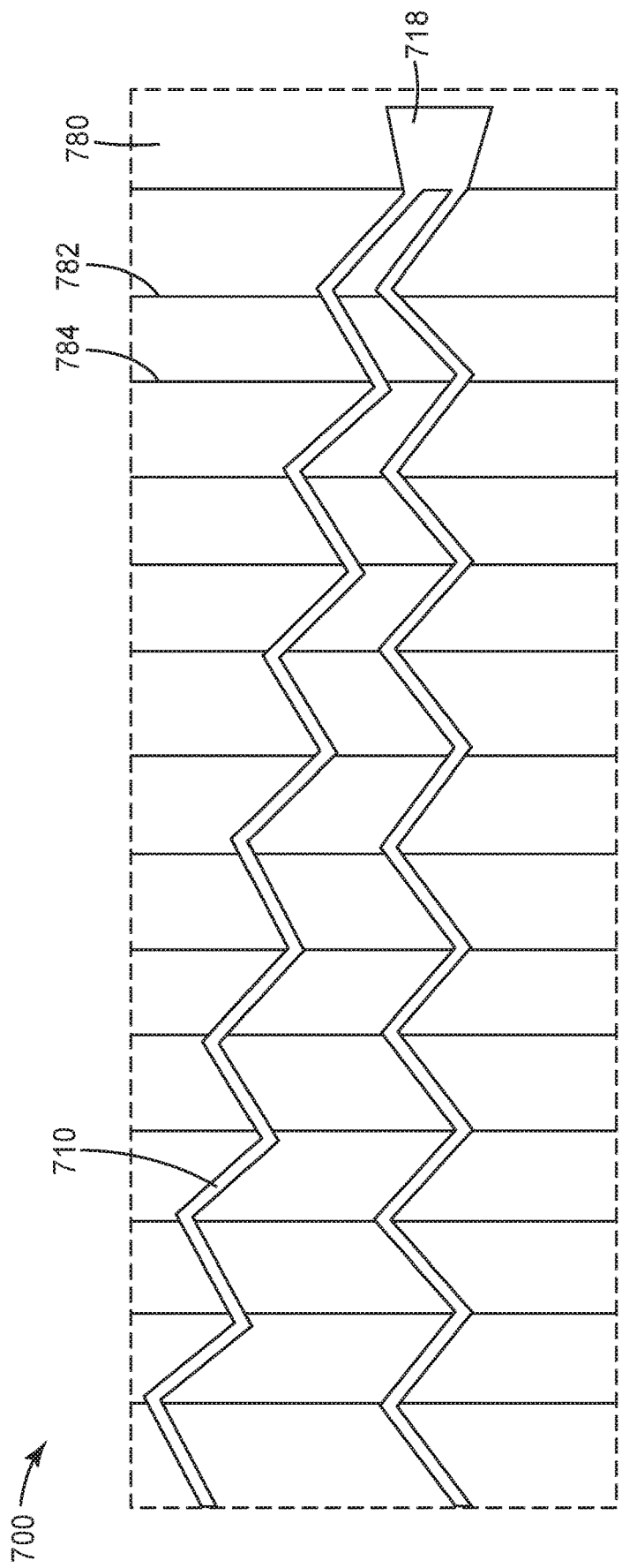
FIG. 7 is a top plan view of a portion of an electrical conductor disposed on a structured surface.

FIG. 7 is a top plan view of a portion of an electrical conductor disposed on a structured surface. Portion 700 includes conductor 710 having joint 718 and structured surface 780 including peaks 782 and valleys 784.

Conductor 710 may closely follow the contours of structured surface 780, and may in some embodiments be attached to or even formed as part of structured surface 780. In some embodiments, conductor 710 may be attached or adhered only at the peaks, only at the valleys, only at the peaks and valleys, or not at the peaks and valleys. Structured surface 780 may be the primary substrate for conductor 710 or it may be disposed on another substrate. In some embodiments, structured surface 780 may itself be stretchable or deformable, in some cases stretchable to 1.5 times an unstretched dimension or even more without tearing.

Structured surface includes peaks 782 and valleys 784. The peaks and valleys and their relative height and depth may depend on the desired application and performance. In some embodiments, the opposite side of structured surface 780 may be a substantially smooth or flat surface. In this case, the thickness of the substrate varies between the valleys and peaks and is essentially dictated by the structured surface. In some embodiments, the peaks and valleys may make up a plurality of linear microstructures. In some embodiments, the conductor extends across at least two linear microstructures. In some embodiments, the microstructures may be substantially triangular or prismatic in shape; in some embodiments, the microstructures may be curved or rounded as, for example, lenslets. In some embodiments, the shape of the microstructures may change along one or more dimensions of the substrate, or a characteristic of the microstructures may change, such as their pitch, height, depth, or shape. In some embodiments these characteristics may smoothly change along a direction of the structured surface; in some embodiments these characteristics may change abruptly, periodically, or pseudorandomly. Different portions of the overall assembly may have differently oriented peaks and valleys or peaks and valleys with different properties (pitch, height, prism angle, shape etc.)

In some embodiments, joint 718 may be used to connect strands of conductor 710, to provide structural support, or redistribute forces as the overall assembly bends or stretches. In some embodiments, joint 718 may not be used. If used, joint 718 may have any suitable shape depending on the desired application. Joint 718 may be substantially thicker than the rest of conductor 710. Only one joint is shown in the portion depicted in FIG. 7; however, in some embodiments, more may be used if suitable for the desired application.

Conductor 718 may undulate or curve outside of conforming to structured surface 780. For example, the projection of conductor 718 may have some or all of the shape characteristics as described for conductors 110 and 210 in FIGS. 1 and 2, for example. In some embodiments, the conductor may be thicker and/or wider at one or more of the peaks and valleys than, in particular, halfway between peaks and valleys. In some embodiments, conductor 710 may have a continuous radius of curvature.

For any of the conductors described herein having thicker portions and thinner portions, or wider portions and narrower portions, the ratio of the width of the wider or thickness of the thicker portion to that of the narrower or thinner portion, respectively, may be at least 1.1, 1.5, 2, or even more. In some embodiments, the conductors may have a lower maximum strain under stress than a conductor of the same shape, except that the conductor is either of a uniform width, of a uniform thickness, or of both a uniform width and a uniform thickness. In some embodiments, the conductor may have at least a 25% lower maximum strain, at least a 33% lower maximum strain, or even at least a 50% maximum strain. In some embodiments, the conductors may exhibit a greater uniformity of stress across the structure; for example, a ratio of the maximum local stress to the average local stress may be reduced by 25%, 33%, or even 50% compared to a conductor of the same shape, except that the conductor is either of a uniform width, of a uniform thickness, or of both a uniform width and a uniform thickness.

The following are embodiments of the present invention.

Embodiment 1 is an elongated conductor centered on an axis along a length of the conductor, such that: the axis has a continuous first derivative with respect to a reference line, the reference line being parallel to an elongation direction of the conductor; the first derivative is zero at a plurality of spaced apart first locations; the axis has a second derivative with respect to the reference line discontinuous at at least one second location; and the conductor at each first location is wider than at each second location.

Embodiment 2 is an elongated conductor centered on an axis along a length of the conductor, such that: the axis has a continuous first derivative with respect to a reference line, the reference line being parallel to an elongation direction of the conductor; the first derivative is zero at a plurality of spaced apart first locations; the axis has a second derivative with respect to the reference line that is substantially zero at at least one second location; and the conductor at each first location is wider than at each second location.

Embodiment 3 is the conductor of embodiment 2, wherein the at least one second location comprises at least two second locations.

Embodiment 4 is an elongated undulating conductor centered on an axis along a length of the conductor and defining a plane of the conductor, the conductor having a width along a direction parallel to the plane of the conductor, such that along the length of the conductor: the axis has a continuous radius of curvature; and at a plurality of spaced apart first locations the axis has a local minimum radius of curvature and the conductor has a local maximum width.

Embodiment 5 is the conductor of embodiment 4, wherein the local maximum width at each first location is greater than the width of the conductor at any other location that is not a first location.

Embodiment 6 is the conductor of embodiment 4, wherein a magnitude of a second derivative of the axis with respect to a reference line, the reference line being parallel to an elongation direction of the conductor, is continuous along the length of the conductor.

Embodiment 7 is an electrically continuous conductor elongated along a length of the conductor, the conductor having a substantially constant height, a varying width, and a varying radius of curvature along the length of the conductor, such that along the length of the conductor, a greater radius of curvature of the conductor corresponds to a smaller width of the conductor and a smaller radius of curvature of the conductor corresponds to a greater width of the conductor.

Embodiment 8 is the conductor of embodiment 7, wherein along the length of the conductor, locations of substantially equal radii of curvature correspond to substantially equal widths.

Embodiment 9 is an electrically continuous conductor elongated along a length of the conductor, the conductor having a varying width and a varying radius of curvature along the length of the conductor, such that along the length of the conductor, the width of the conductor increases with decreasing radius of curvature of the conductor, and the width of the conductor decreases with increasing radius of curvature of the conductor.

Embodiment 10 is an elongated conductor centered on an axis along a length of the conductor, at each of a plurality of spaced apart first locations on the axis, a line tangent to the axis at the first location being parallel to a same reference line being parallel to an elongation direction of the conductor, at each of a plurality of spaced apart second locations on the axis, a line tangent to the axis at the second location not being parallel to the reference line, the conductor being wider at each first location and narrower at each second location.

Embodiment 11 is a conductor assembly comprising: a flexible stretchable substrate stretchable along a first direction up to 1.5 times an original unstretched dimension of the substrate without tearing; and a conductor disposed on the substrate and generally extending along the first direction, the conductor centered on an axis along a length of the conductor, such that for a plurality of alternating first and second locations along the axis the conductor is wider at each first location than at each second location.

Embodiment 12 is the conductor assembly of embodiment 11, wherein the axis has a smaller radius of curvature at each first location than at each second location.

Embodiment 13 is an electrically continuous conductor elongated along a length of the conductor, the conductor having a varying thickness and a varying radius of curvature along the length of the conductor, such that along the length of the conductor, a greater radius of curvature of the conductor corresponds to a smaller thickness of the conductor and a smaller radius of curvature of the conductor corresponds to a greater thickness of the conductor.

Embodiment 14 is the conductor of embodiment 13 having a varying width along the length of the conductor, such that along the length of the conductor, a greater radius of curvature of the conductor corresponds to a smaller width of the conductor and a smaller radius of curvature of the conductor corresponds to a greater width of the conductor.

Embodiment 15 is a radio frequency identification tag comprising: a flexible stretchable substrate; and an antenna disposed on the substrate and centered on an axis along a length of the antenna, such that for a plurality of spaced apart first and second locations along the axis: the antenna is wider at each first location than at each second location; and the axis has a smaller radius of curvature at each first location than at each second location.

Embodiment 16 is the tag of embodiment 15, wherein the substrate is stretchable up to 1.5 times an original unstretched dimension of the substrate without tearing.

Embodiment 17 is a radio frequency identification tag comprising: a flexible stretchable substrate; and an antenna disposed on the substrate and having a plurality of first zones and a plurality of second zones, each first zone comprising a plurality of concentric first arcs, each second zone comprising a plurality of concentric second arcs, each first arc of each first zone being wider than each second arc of each second zone.

Embodiment 18 is a radio frequency identification tag comprising: a flexible stretchable substrate; and an elongated undulating electrode disposed on the substrate and centered on an axis along a length of the electrode, such that along the length of the electrode: the axis has a continuous radius of curvature; and the electrode comprises parallel narrower top and wider bottom substantially planar surfaces with corresponding top and bottom opposing first and second lateral edges, such that for each point along the axis, a plane normal to the axis at the point intersects the top and bottom first edges at corresponding top and bottom first points, a straight line connecting the top and bottom first points making an angle with the bottom surface of the electrode that is between 60 and 85 degrees.

Embodiment 19 is a radio frequency identification tag comprising: a flexible substrate stretchable along a first direction and comprising a structured surface comprising a plurality of linear structures extending along a second direction perpendicular to the first direction; and an antenna formed on the structured surface and extending across at least two linear structures in the plurality of linear structures.

Embodiment 20 is the radio frequency identification tag of claim 19, wherein the plurality of linear structures are linear prisms.

Descriptions for elements in figures should be understood to apply equally to corresponding elements in other figures, unless indicated otherwise. The present invention should not be considered limited to the particular examples and embodiments described above, as such embodiments are described in detail in order to facilitate explanation of various aspects of the invention. Rather, the present invention should be understood to cover all aspects of the invention, including various modifications, equivalent processes, and alternative devices falling within the scope of the invention as defined by the appended claims and their equivalents.

What is claimed is:
1. A radio frequency identification tag comprising:
a flexible stretchable substrate; and
an antenna comprising an electrical conductor disposed on the substrate and centered on an axis along a length of the antenna, such that for a plurality of spaced apart first and second locations along the axis:
the electrical conductor is wider at each first location than at each second location;
the electrical conductor is thicker at each first location than at each second location; and
the axis has a smaller radius of curvature at each first location than at each second location.

2. The radio frequency identification tag of claim 1, wherein the substrate is stretchable up to 1.5 times an original unstretched dimension of the substrate without tearing.

3. The radio frequency identification tag of claim 1, wherein opposing edges of the antenna curve in a same direction at each of the first and second locations.

4. A radio frequency identification tag comprising:
a flexible stretchable substrate; and
an antenna comprising an electrical conductor disposed on the substrate and having a plurality of first zones of the electrical conductor and a plurality of second zones of the electrical conductor, each first zone comprising a plurality of concentric first arcs, each second zone comprising a plurality of concentric second arcs, each first arc of each first zone being wider and thicker than each second arc of each second zone.

5. A radio frequency identification tag comprising:
a flexible stretchable substrate; and
an elongated undulating electrode disposed on the substrate and centered on an axis along a length of the electrode, such that along the length of the electrode:
the axis has a continuous radius of curvature; and
the electrode comprises parallel narrower top and wider bottom substantially planar surfaces with corresponding top and bottom opposing first and second lateral edges, such that for each point along the axis, a plane normal to the axis at the point intersects the top and bottom first edges at corresponding top and bottom first points, a straight line connecting the top and bottom first points making an angle with the bottom surface of the electrode that is between 60 and 85 degrees, such that a cross-sectional shape of the electrode has the shape of a trapezoid.

6. A radio frequency identification tag comprising:
a flexible substrate stretchable along a first direction and comprising a structured surface comprising a plurality of linear structures extending along a second direction perpendicular to the first direction; and
an antenna formed on the structured surface and extending across at least two linear structures in the plurality of linear structures.

7. The radio frequency identification tag of claim 6, wherein the plurality of linear structures are linear prisms.

\* \* \* \* \*